Figure 1:
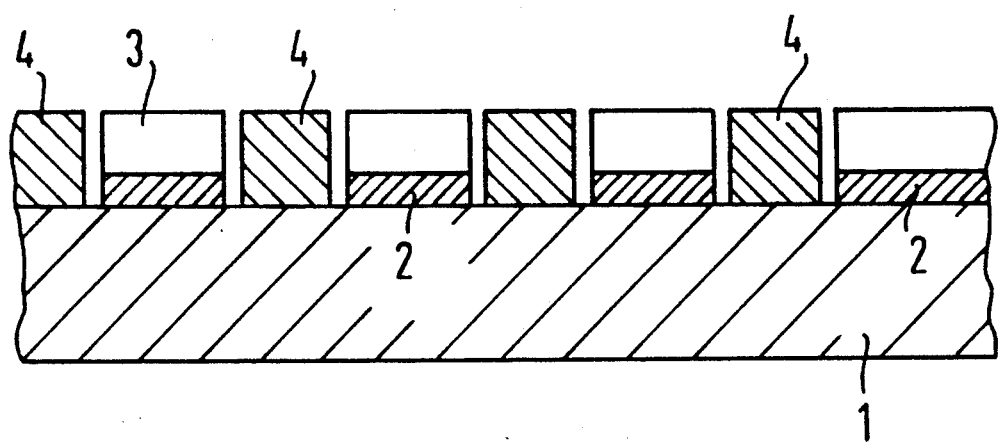

United States Patent [19]
Maiwald

[11] Patent Number: 5,172,853
[45] Date of Patent: Dec. 22, 1992

[54] METHOD FOR APPLYING SOLDER TO PRINTED WIRING BOARDS AND PRINTED WIRING BOARD TO WHICH SOLDER HAS BEEN APPLIED

[75] Inventor: Werner Maiwald, Bad Aibling, Fed. Rep. of Germany

[73] Assignee: Siemens Aktiengesellschaft, Munich, Fed. Rep. of Germany

[21] Appl. No.: 801,430

[22] Filed: Dec. 2, 1991

[30] Foreign Application Priority Data

Nov. 30, 1990 [EP]  European Pat. Off. ........ 90123005.2

[51] Int. Cl.$^5$ .............................................. H05K 3/34
[52] U.S. Cl. ................................... 228/248; 228/254; 427/123; 427/383.7; 427/360
[58] Field of Search .................. 228/118, 215, 173.1, 228/173.3, 180.2, 248, 254, 56.3; 427/278, 282, 360, 123, 383.7

[56] References Cited

U.S. PATENT DOCUMENTS

| | | | |
|---|---|---|---|
| 2,615,768 | 10/1952 | Schluchter | 427/360 |
| 4,485,166 | 11/1984 | Herwig et al. | 430/260 |
| 4,752,027 | 6/1988 | Gschwend | 228/180.2 |

FOREIGN PATENT DOCUMENTS

| | | |
|---|---|---|
| 0063304 | 10/1982 | European Pat. Off. |
| 3535685 | 4/1987 | Fed. Rep. of Germany |
| 3810653 | 5/1989 | Fed. Rep. of Germany |
| 2113596 | 4/1990 | Japan |

OTHER PUBLICATIONS

Metals Handbook Ninth Edition, vol. 6, p. 1071, copyright 1983.
Derwent-Wpil, No. 89-367154, Derwent Publications Ltd, London, GB.
Dr.-Ing. Dieter Friedrich (SMW Electronik GmbH) SMT/ASIC Hybrid 1990 Int. Conf. pp. 1-12 "Optipad-Eine Leiterplattenoberfl/ che zur prozeßtechnischen ...".

Primary Examiner—Samuel M. Heinrich
Attorney, Agent, or Firm—Herbert L. Lerner; Laurence A. Greenberg

[57] ABSTRACT

A method for applying solder to printed wiring boards includes producing a printed wiring board with electrically conductive regions. Soldering paste is applied as a solder deposit on the electrically conductive regions. The solder deposits are melted to form hump-shaped solid solder applications joined to the printed wiring board. The hump-shaped solder applications are levelled out by areally applying pressure to the solder applications in the direction of the printed wiring board. A printed wiring board to which solder has been applied includes a wiring board surface having regions to be equipped with components according to an SMD process. Solder applications are disposed on the regions in the form of a solid solder layer. The solid solder layer has a pressed or rolled surface extended substantially parallel to the wiring board surface.

13 Claims, 1 Drawing Sheet

METHOD FOR APPLYING SOLDER TO PRINTED WIRING BOARDS AND PRINTED WIRING BOARD TO WHICH SOLDER HAS BEEN APPLIED

The invention relates to a method for applying solder to printed wiring or circuit boards, and a printed wiring or circuit board to which solder has been applied.

Users involved in manufacturing electronic components are increasingly interested in printed wiring boards that can be processed directly. Reflow-solderable SMD printed wiring boards that already have solder applied beforehand and can be equipped with SMD components directly and then soldered by the reflow soldering process are desirable. Of the various methods for applying solder to printed wiring boards known at this time, the most important ones for such use are described in German Patent DE-PS 38 10 653. Further details can be found in the article entitled "Optipad— Eine Leiterplattenoberfläche zur prozeßtechnischen und metallurgischen Optimierung der Reflow-Löttechniken in der SMT" [Optipad—A Printed Wiring Board Surface for Optimizing Reflow Soldering Techniques in Terms of Processes and Metallurgy in SMT], 1990 International Conference on SMT/ASIC/Hybrids Jan. 12, 1990, by D. Friedrich.

In one of the frequently used methods, soldering paste that forms flat soldering deposits is applied to the SMD soldering regions (solder pads) with the aid of printing or dispensing methods. After the SMDs are assembled on the printed wiring board printed with the soldering deposits, the deposits are then heated relatively slowly to above the melting point of the particular soldering alloy in the reflow furnace, and thus the soldered connection is made by melting the soldering paste. However, that method is especially problematic because the soldering paste is not solid but instead has a high proportion of volatile non-metallic ingredients, such as solvents. In the soldering process, the uneven supply of solder can lead to soldered connections of reduced quality and it also slows down the process, since the volatile ingredients have to be evaporated gradually by slow heating.

Another known method is applying solder to printed wiring boards by immersion, in which a prepared printed wiring board is dipped in a bath of solder, then removed and cooled down, in the course of which the metallized regions of the printed wiring board that are not provided with a soldering stop agent are provided with an application of solder. However, because of the surface tension of the solder, the applied solder has a severely curved surface which is somewhat hump-shaped. The applications of solder also have variable heights. The possibility exists of compensating for such a variation in height by using a hot air leveling process, in which a solder application that is too high is removed again by using an aimed flow of hot air.

However, such a leveling process is expensive and entails difficulties, for instance because it uses flux which becomes very expensive regarding the future disposal thereof. In the aforementioned German patent, an immersion solder application method is therefore proposed in which the solder pads are outlined before the immersion with a limiting layer of defined layer thickness that hinders the application of solder. The voids filled with liquid solder are still covered in the immersion bath with a closure element at a defined pressing force, and that is followed by removal from the bath and then cooling.

In view of the usual SMD components, it is generally necessary in this process to detach the limiting layer from the surface of the printed wiring board either mechanically or chemically. Accordingly, this process is especially expensive because use is made of a temporary solder stop mask, which must be both removable and heat-proof. Moreover, the immersion operation entails a considerable temperature strain on the printed wiring boards. Last but not least, the chemical detachment of the limiting layer, for example by means of an alkaline washing procedure, may also cause subsequent damage.

It is accordingly an object of the invention to provide a method for applying solder to printed wiring boards and a printed wiring board to which solder has been applied, which overcomes the hereinafore-mentioned disadvantages of the heretofore-known methods and devices of this general type, which is improved from both an industrial and an environmental standpoint and not the least of all from the standpoint of expense, and which the user can employ directly in the SMD assembly process.

With the foregoing and other objects in view there is provided, in accordance with the invention, a method for applying solder to printed wiring boards, which comprises a) producing a printed wiring board with electrically conductive regions (solder pads); b) applying soldering paste as a solder deposit on the electrically conductive regions; c) melting the solder deposits to form hump-shaped solid solder applications joined to the printed wiring board; and d) leveling out the hump-shaped solder applications by areally applying pressure to the solder applications in the direction of the printed wiring board.

In accordance with another mode of the invention, there is provided a method which comprises applying non-eutectic soldering paste in method step b).

In accordance with a further mode of the invention, there is provided a method which comprises applying the solder deposit to the electrically conductive regions in method step b) by screen printing, mask printing or a metering method.

In accordance with an added mode of the invention, there is provided a method which comprises applying a dry film solder stop mask of defined layer thickness in method step a) to regions to which solder is not to be applied.

In accordance with an additional mode of the invention, there is provided a method which comprises dimensioning a quantity of the soldering paste in method step b) to make the flat-pressed solder application flush with a surface of the solder stop mask layer facing away from the printed wiring board after method step d) has been carried out.

In accordance with yet another mode of the invention, there is provided a method which comprises reinforcing the leveling of the hump-shaped solder application in method step d) by heating the applied solder.

With the objects of the invention in view, there is also provided a printed wiring board to which solder has been applied, comprising a wiring board surface having regions to be equipped with components according to an SMD process, and solder applications disposed on the regions in the form of a solid solder layer, the solid solder layer having a pressed or rolled surface extended substantially parallel to the wiring board surface.

In accordance with a concomitant feature of the invention, there are provided non-moistening partitions in the form of a dry film solder stop mask separating the solid solder layers from one another.

Other features which are considered as characteristic for the invention are set forth in the appended claims.

Although the invention is illustrated and described herein as embodied in a method for applying solder to printed wiring boards and a printed wiring board to which solder has been applied, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
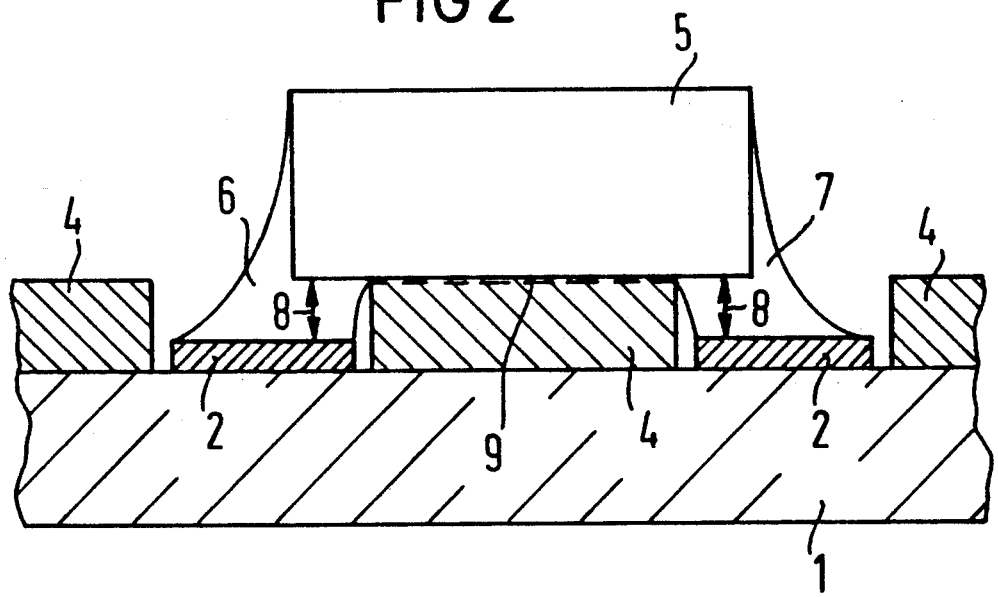

FIG. 1 is a fragmentary, diagrammatic, sectional view of a printed wiring board with a finished application of solder effected by the method according to the invention; and FIG. 2 is a view similar to FIG. 1 of an SMD component for which the soldering thereof to the printed wiring board has been completed.

Referring now to the figures of the drawing in detail and first, particularly, to FIG. 1 thereof, there is seen a printed wiring or circuit board 1 with solder applied, which includes a base material, onto which a conductive copper lining 2 (solder pad) is applied in a manner known, at locations intended as SMD soldering regions, according to a method step a). The solder pads 2 are defined in many cases by a solder stop mask 4 made of plastic. In accordance with a method step b), soldering paste is applied to the solder pads 2 as a soldering deposit. This is advantageously done with the aid of printing screens or metal templates, according to the known economical printing process. However, a spot-type application of the soldering paste with the aid of a dispenser is also possible, for example. Planar solder deposits are then melted, for example by infrared radiation or by heated steam, according to a method step c). During this operation, the volatile components escape from the solder deposit, producing a solid solder application that is firmly joined to the applicable solder pad, but which is severely curved because of its surface tension, especially at its surface, or in other words it has the shape of a hump. The hump-shaped solder application is pressed flat with a suitable tool (such as a press or roller, etc.), according to a method step d). This operation may optionally be reinforced with heat. In other words, the method step d) need not necessarily be carried out immediately after the melting of the solder deposit in method step c). In order to reinforce the leveling, the solder can be changed to a molten or doughy phase in the heating operation. Advantageously, a non-eutectic soldering paste can therefore be used, to enlarge the doughy phase during the flat-pressing process. With the tools mentioned above, it is possible to either individually press solder applications flat on the printed wiring board, or a plurality of the solder applications can be pressed simultaneously, or all of the solder applications can be pressed flat, in a simple manner. The result in each case is a solid solder layer 3 that is relatively flat on its surface. Despite the melting, the final shape of the finished solder applications (solder layer 3) is again generally flat and the surface is formed by the press or roller.

The solder stop mask 4 having a defined layer thickness as shown in FIG. 1, is applied to the regions of the printed wiring board that are not to have solder applied to them during the method step a). It has proved to be particularly economical and simple to dimension the quantity of soldering paste in the method step b) in such a way that after the method step d) has been carried out, the flat-pressed solder application (solder layer 3) is flush with the top of the solder stop mask layer 4 that faces away from the printed wiring board.

In SMD printed wiring boards, a solder stop mask of either dry film or liquid film is fundamentally advantageous and necessary. The advantages of a dry film solder stop mask are, among others, that a defined minimum spacing, which is known as the soldering gap, between a component 5 and the printed wiring board 1, is obtained. In FIG. 2, the printed wiring board 1 with the solder pads 2 and a dry film solder stop mask 4 is shown. The SMD component 5, which can initially be secured to the printed wiring board 1 by an adhesive layer 9, is already completely soldered by means of soldered connections 6 and 7. Due to its elasticity, a soldering gap 8 has a very favorable effect on the reliability of the soldered connections 6 and 7.

The method according to the invention is suitable for all types of printed wiring boards and other base materials. Further processing can be carried out in the usual ways. Due to the ever-increasing scale of integration in SMD ICs, there is a trend toward finer and finer connection configurations (which are known as fine-pitch ICs). Another advantage of the invention is that for the narrow spacings that arise in such ICs, for example, very much higher solder layers 3 can be applied than in the methods known previously. This is possible because the solder stop mask 4 which is in the form of dry film creates a non-moistening partition between the solder layers 3, so that they cannot melt together in the melting process in the course of the reflow soldering. Due to tolerance reasons for the IC, it is advantageous to make the solder layer 3 as high as possible. The thickness of the solder stop masks 4 and thus of the solder deposit and solder layer 3 may be between 20 and 300 $\mu$m, and preferably between 150 and 200 $\mu$m.

The printed wiring boards with solder applied in accordance with the invention offer the additional advantage of permitting the relatively high and planar solder surface to be cleaned simply (mechanically, for instance) before further processing, so that soldering with little or no flux becomes possible.

In the method according to the invention, the solder paste can be applied to both pre-coated solder pads, in other words such pads that have already been applied, and to clean copper surfaces. If they are applied to clean copper, then temperature-intensive tinning after the hot-air leveling becomes unnecessary. This becomes especially advantageous with multilayer printed wiring boards.

I claim:

1. A method for applying solder to printed wiring boards, which comprises:
   a) producing a printed wiring board with electrically conductive regions;
   b) applying soldering paste as a solder deposit on the electrically conductive regions;

c) melting the solder deposits to form hump-shaped solid solder applications joined to the printed wiring board; and d) leveling out the hump-shaped solder applications by areally applying pressure to the solder applications in the direction of the printed wiring board, and reinforcing the leveling of the hump-shaped solder application by heating the applied solder.

2. The method according to claim 1, which comprises applying non-eutectic soldering paste in method step b).

3. The method according to claim 1, which comprises applying the solder deposit to the electrically conductive regions in method step b) by screen printing.

4. The method according to claim 1, which comprises applying the solder deposit to the electrically conductive regions in method step b) by mask printing.

5. The method according to claim 1, which comprises applying the solder deposit to the electrically conductive regions in method step b) by a metering method.

6. The method according to claim 1, which comprises applying a dry film solder stop mask of defined layer thickness in method step a) to regions to which solder is not to be applied.

7. The method according to claim 6, which comprises dimensioning a quantity of the soldering paste in method step b) to make the flat-pressed solder application flush with a surface of the solder stop mask layer facing away from the printed wiring board after method step d) has been carried out.

8. A method for applying solder to printed wiring boards, which comprises:

a) producing a printed wiring board with electrically conductive regions and applying a dry film solder stop mask of defined layer thickness to regions to which solder is not to be applied;

b) applying soldering paste as a solder deposit on the electrically conductive regions;

c) melting the solder deposits to form hump-shaped solid solder applications joined to the printed wiring board; and d) leveling out the hump-shaped solder applications by areally applying pressure to the solder applications in the direction of the printed wiring board.

9. The method according to claim 8, which comprises applying non-eutectic soldering paste in method step b).

10. The method according to claim 8, which comprises applying the solder deposit to the electrically conductive regions in method step b) by screen printing.

11. The method according to claim 8, which comprises applying the solder deposit to the electrically conductive regions in method step b) by mask printing.

12. The method according to claim 8, which comprises applying the solder deposit to the electrically conductive regions in method step b) by a metering method.

13. The method according to claim 8, which comprises dimensioning a quantity of the soldering paste in method step b) to make the flat-pressed solder application flush with a surface of the solder stop mask layer facing away from the printed wiring board after method step d) has been carried out.

* * * * *